United States Patent
Kuhn et al.

(10) Patent No.: US 6,497,764 B2
(45) Date of Patent: Dec. 24, 2002

(54) METHOD FOR GROWING SiC SINGLE CRYSTALS

(75) Inventors: Harald Kuhn, Erlangen (DE); Rene Stein, Röttenbach (DE); Johannes Völkl, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/761,808

(22) Filed: Jan. 16, 2001

(65) Prior Publication Data

US 2001/0015169 A1 Aug. 23, 2001

Related U.S. Application Data

(63) Continuation of application No. PCT/DE99/01966, filed on Jul. 1, 1999.

(30) Foreign Application Priority Data

Jul. 13, 1998 (DE) ............................... 198 31 362

(51) Int. Cl.[7] ............................... C30B 29/36
(52) U.S. Cl. ................ 117/99; 117/105; 117/109; 117/951
(58) Field of Search .................. 117/951, 109, 117/105, 99

(56) References Cited

U.S. PATENT DOCUMENTS

| | | | | |
|---|---|---|---|---|
| 3,577,285 A | * | 5/1971 | Rutz | 117/951 |
| 3,813,340 A | * | 5/1974 | Knippenberg et al. | 117/951 |
| 4,147,572 A | * | 4/1979 | Vodakov et al. | 117/951 |
| 4,624,735 A | * | 11/1986 | Koyama et al. | 117/951 |
| 5,441,011 A | * | 8/1995 | Takahashi et al. | 117/84 |
| 6,056,820 A | * | 5/2000 | Balakrishna et al. | 117/200 |

FOREIGN PATENT DOCUMENTS

| | | | | |
|---|---|---|---|---|
| DE | 3230727 C2 | | 2/1987 | |
| EP | 0403887 A1 | | 12/1990 | |
| EP | 554047 | * | 4/1993 | 117/951 |
| JP | 4-77399 | * | 3/1992 | 117/951 |
| JP | 6316499 | | 11/1994 | |

OTHER PUBLICATIONS

"SiC–bulk growth by physical–vapor transport and its global modelling", D. Hofmann et al., Journal of Crystal Growth 174, 1997, pp. 670–674.

"Improvement in the growth rate of cubic silicon carbide bulk single crystals grown by the sublimation method", H.N. Jayatirtha et al., Journal of Crystal Growth 174, 1997, pp. 663–668.

* cited by examiner

Primary Examiner—Robert Kunemund
(74) Attorney, Agent, or Firm—Laurence A. Greenberg; Werner H. Stemer; Ralph E. Locher

(57) ABSTRACT

A method is described for growing at least one silicon carbide (SiC) single crystal by sublimation of a SiC source material. Silicon, carbon and a SiC seed crystal are introduced into a growing chamber. Then, the SiC source material is produced from the silicon and the carbon in a synthesis step that takes place before the actual growing. The growing of the SiC single crystal is then carried out immediately after the synthesis step. The carbon used is a C powder with a mean grain diameter of greater than 10 μm.

18 Claims, 1 Drawing Sheet

US 6,497,764 B2

METHOD FOR GROWING SiC SINGLE CRYSTALS

CROSS-REFERENCE TO RELATED APPLICATION

This is a continuation of copending International Application PCT/DE99/01966, filed Jul. 1, 1999, which designated the United States.

BACKGROUND OF THE INVENTION

Field of the Invention

The invention relates to a method for growing at least one silicon carbide (SiC) single crystal by sublimation of a SiC source material.

The sublimation of industrial-grade SiC in powder form and growing the SiC in a gas phase on a monocrystalline SiC seed crystal is a method for the production of a SiC single crystal known from German Patent DE 32 30 727 C2. The gas mixture that is formed during the sublimation primarily contains the components Si, $Si_2C$, $SiC_2$ and SiC. The gas mixture is also referred to below as "SiC in the gas phase". The source material used is usually industrial-grade silicon carbide in granular form and of high purity, the silicon carbide preferably having a grain size of approximately 200 to 300 $\mu$m. The SiC source material is produced prior to the growing process of the SiC single crystal and is introduced as a prepared source material into a growing chamber.

The article titled "SiC-Bulk Growth By Physical-Vapor Transport And Its Global Modeling", by D. Hofmann et al., Journal of Crystal Growth, Vol. 174, 1979, pages 669 to 674 describes a method for the synthesis of a SiC powder which is used as a source material from elemental silicon (Si) granules and carbon (C) powder.

Another method for producing the source material in the form of SiC powder is known from the article titled "Improvement In The Growth Rate Of Cubic Silicon Carbide Bulk Single Crystals Grown By The Sublimation Method", by H. N. Jayatirtha et al., Journal of Crystal Growth, Vol. 174, 1997, pages 662 to 668. In this case, high-purity silicon and high-purity carbon react with one another for a total of three hours at 1800° C. Then, the powder is removed from the reaction furnace and is subjected to further treatment steps. In particular, a three hour oxidation is carried out at 1200° C., in order to remove excess carbon. Then, an etching step is carried out, in order to eliminate traces of $SiO_2$ that have formed as a result of the oxidation.

A common feature of all the above-mentioned methods for the production of the source material in the form of the SiC powder is that the production of the SiC powder and the actual growing of the SiC single crystal represent individual processes that are carried out independently of one another.

By contrast, Published Japanese Patent Application JP 6-316 499 A describes a method for the production of an SiC single crystal which in one first process step also includes the formation of the SiC source material from silicon and carbon as an integral part of the growing process. The growing operation in the narrower sense takes place as a result of the sublimation of the SiC source material produced in the previous process step and as a result of deposition of the SiC in the gas phase on an SiC seed crystal. The starting materials used for the production of the SiC source material are carbon in the form of a graphite block or carbon (C) powder with a grain diameter of below 10 $\mu$m and granular silicon with a grain diameter of between 2 and 5 mm. The grain diameter of the silicon is given as a parameter that is not critical and, if appropriate, may also assume values outside the diameter range stated. However, for the C powder employed it is expressly stated that if the grain size is over 10 $\mu$m only the surface of the C powder reacts with silicon, and therefore the SiC source material formed is not suitable.

In a second embodiment, in which a graphite block of porous graphite with a relative density of 0.5 $g/cm^3$ is used instead of the C powder, the production process of the SiC source material and the growing process of the SiC single crystal do not take place within a single process sequence. The growing chamber is opened again after the SiC source material has been produced, in order for the SiC seed crystal to be introduced. Only then is the actual growing commenced. The relative density of the porous graphite used may also adopt values other than 0.5 $g/cm^3$. The upper limit specified is a relative density of 1.0 $g/cm^3$, since at higher levels SiC source material is no longer formed in sufficient quantities.

The process conditions during the production of the SiC source material involve a temperature in the range between 1150° C. and 1800° C. and a pressure of less than 200 Torr, corresponding to approximately 266 mbar.

When using C powder with a grain diameter of less than 10 $\mu$m, the reaction taking place during the production of the SiC source material can very easily lead to fluidization of particles, in particular of the C powder. As a result, deposits are formed on the SiC seed crystal, which has an adverse effect on the quality of the growing which is then to be carried out.

SUMMARY OF THE INVENTION

It is accordingly an object of the invention to provide a method for growing SiC single crystals that overcomes the above-mentioned disadvantages of the prior art methods of this general type, which avoids the fluidization of the C powder which occurs in the prior art and therefore leads overall to an improved quality of the SiC single crystal which is grown.

With the foregoing and other objects in view there is provided, in accordance with the invention, a method for growing at least one silicon carbide (SiC) single crystal by sublimation of an SiC source material. The method includes introducing silicon (Si), carbon (C) and an SiC seed crystal into a growing chamber, the carbon being a C powder with a mean diameter of powder grains of greater than 10 $\mu$m. Producing the SiC source material from the silicon and the carbon in a synthesis step carried out before a growing step; and carrying out the growing step by growing the SiC single crystal immediately after the synthesis step.

The invention is based on the recognition that, unlike in the customary procedure used in the specialist field, which is defined by the technical teaching disclosed by Published Japanese Patent Application JP 6-316 499 A, the use of C powder with a mean grain diameter of greater than 10 $\mu$m is still possible and even advantageous. On account of the larger geometry and the consequently higher weight, this measure avoids the undesirable fluidization of the C powder during the production of the SiC source material. Therefore, during this process step there is no undesirable deposition on the SiC seed crystal, which is already in the growing chamber while the SiC source material is being produced. The recognition that C powder even with a mean grain diameter of greater than 10 $\mu$m reacts with the silicon so well that the result is a SiC source material of high quality which is eminently suitable for the subsequent growing of the SiC single crystal is particularly surprising.

The carbon used may be both synthetic and natural carbon.

In a first preferred configuration, the C powder has a mean grain diameter of greater than 20 $\mu$m, and in particular of greater than 30 $\mu$m. The larger the mean grain diameter, the more successfully the undesirable fluidization of the C powder is suppressed.

An embodiment in which the C powder is selected to have a grain size which is less than 200 $\mu$m and preferably less than 80 $\mu$m is also advantageous. If the grain size is below the upper limits given above, all the carbon inside the powder grain still reacts with the silicon. By contrast, if a C powder with a larger mean grain diameter is provided, the carbon actually only reacts with the silicon at the surface of the powder grain. As a result, there is an undesirable excess quantity of unbonded carbon and silicon atoms in the SiC source material.

Another advantageous embodiment of the method involves a type of carbon in which the reaction with the silicon to form the SiC source material takes place endothermally or at least without significant amounts of energy being released being used for the carbon in the C powder. This is because undesirable fluidization of particles, in this case of both carbon and silicon particles, may also be caused by an exothermic reaction between the silicon and the carbon. The chemical energy released in this case leads to the undesirable fluidization with the adverse effects described above. With the preferred types of carbon mentioned, the reaction with the silicon takes place in particular without volumetric expansion. Thermoanalytical investigation of the reaction reveals that energy is absorbed or energy is released only to such a slight extent that it is too low to fluidize particles.

With a view to achieving a reaction between the C powder and the silicon which proceeds as far as possible without any energy being released, a variant in which a type of carbon whose powder grains are composed of a multiplicity of individual crystallites is particularly advantageously used. In this case, one powder grain preferably contains at least 10 to 20 crystallites. The polycrystalline structure of the individual grains then makes a decisive contribution to an overall reaction that proceeds substantially without energy being released. During heating, the silicon melts first. Prior to this, there is virtually no reaction between the two elements. The melting is endothermic. When melting commences, the reaction of the SiC synthesis, which in itself is exothermic, also starts. On account of the polycrystalline structure of the C powder grains, the synthesis reaction proceeds not only at the grain surface but also in the interior of the grains. Since the endothermic melting and the exothermic synthesis reaction take place substantially in parallel, the energy balance is practically neutral. In the case of a type of carbon whose powder grains contain only a few crystallites, by contrast, the two subreactions proceed successively. The advantageous energy compensation then cannot occur, and the energy that is released during the synthesis leads to undesirable fluidization of particles.

An embodiment in which the silicon is selected to be in the form of a silicon (Si) powder is also preferred. In this case, the maximum mean grain diameter of the Si powder is one millimeter. The mean grain diameter is preferably in a range between 100 $\mu$m and 400 $\mu$m. Compared to the grain size of the C powder, the mean grain diameter of the Si powder is a much less critical parameter. The reaction between silicon and carbon to form the SiC source material preferably takes place at temperatures of over 1400° C. Since at these temperatures silicon is no longer in the powder form which was originally introduced, but rather is already in molten form, it is possible to select a significantly larger mean grain diameter for the Si powder than for the C powder.

The silicon, which has become liquid as a result of the melting operation, impregnates the carbon, so that the mixing between the silicon and carbon is determined almost exclusively by the mean grain diameter of the C powder. The upper limit for the mean grain diameter of the Si powder is determined by the fact that if the mean grain diameters are too large, the melting operation takes too long and therefore the carbon cannot optimally be impregnated by molten silicon.

To achieve mixing which is as homogeneous as possible for the reaction between the silicon and carbon, according to an advantageous configuration the Si powder and the C powder are intensively mixed together and then introduced into the growing chamber as a mixture which is as homogeneous as possible. As a result of the intensive mixing, the reaction yield during the production of the SiC source material is improved.

In a preferred variant embodiment, the growing chamber, in preparation for the production process of the SiC source material, is evacuated for several hours at a temperature of between 1000° C. and 1300° C., in particular 1200° C., until a pressure of less than or equal to $10^{-4}$ mbar is reached. After the evacuation, the growing chamber is filled with an inert gas, in particular with argon (Ar), helium (He) or hydrogen ($H_2$). An inert gas pressure in a range between 100 and 1000 mbar is set.

A variant embodiment in which the silicon and the carbon are heated to a synthesis temperature of at least 1200° C. and at most 1900° C. is also advantageous. A synthesis temperature in the range between 1400 and 1600° C. is particularly advantageous, since in this temperature range on the one hand the silicon has already melted and impregnated the carbon and on the other hand the reaction to form the SiC source material takes place with a good yield. The synthesis temperature is maintained for a period of at most three hours, in particular of only at most one hour, so that the silicon which is introduced into the growing chamber and the carbon which is also introduced react with one another as completely as possible and form the desired Sic source material.

A particular advantage of the method resides in no further cooling of the growing chamber and, if appropriate, removal of the SiC source material from the growing chamber after the SiC source material has been produced, since these steps could introduce undesirable impurities into the SiC source material. Therefore, an advantageous variant embodiment involves the growing chamber, starting from the conditions for the production of the SiC source material, being brought to the growing conditions for the SiC single crystal. This results in a rise in the temperature of the SiC source material from the synthesis temperature to a temperature of between 2100° C. and 2500° C. Moreover, at the same time the overall pressure that prevails during the production of the SiC source material is also reduced to at most 30 mbar. Under these conditions, SiC is sublimed out of the SiC source material and then precipitates out of the gas phase on the SiC seed crystal. To ensure corresponding material transport of the SiC in the gas phase, a temperature gradient is established between the SiC source material and the SiC seed crystal or the SiC single crystal that is being formed.

By suitably selected orientations of the SiC seed crystal, it is possible to grow a SiC single crystal of a specific polytype. Therefore, in advantageous embodiments there is provision for the SiC seed crystal to be disposed in the growing chamber in such a way that the SiC single crystal grows on a C side or an Si side of the SiC seed crystal in the direction of a polar axis. The growth on the C side provides a 4H-SiC single crystal, whereas the growth on an Si side provides a 6H-SiC single crystal.

Other features which are considered as characteristic for the invention are set forth in the appended claims.

Although the invention is illustrated and described herein as embodied in a method for growing SIC single crystals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
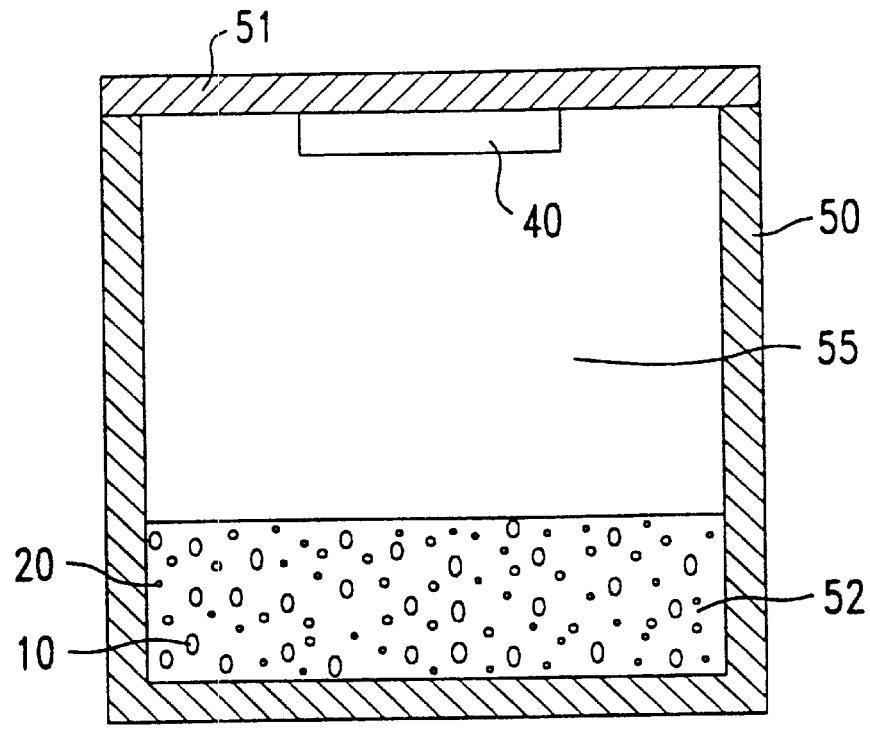
FIG. 1 is a diagrammatic, sectional view of a growing chamber before a process begins, into which an SiC seed crystal and Si and C powders have been introduced according to the invention.

In all the figures of the drawing, sub-features and integral parts that correspond to one another bear the same reference symbol in each case. Referring now to the figures of the drawing in detail and first, particularly, to FIG. 1 thereof, there is shown a growing chamber 50 which is used to grow an SiC seed crystal. Unlike in growth methods which were previously customary, the material introduced into the growing chamber 50 as a starting substance for the growing is not an SiC source material which has been prepared in advance, but rather a mixture of a silicon (Si) powder 10 and a carbon (C) powder 20. In addition to this powder mixture, an SiC seed crystal 40 has also already been introduced into the growing chamber 50. The mixture of the Si powder 10 and the C powder 20 and the SiC seed crystal 40 are separated from one another by a clear space 55. The mixture of the Si powder 10 and the C powder 20 is situated in a lower storage region 52 of the growing chamber 50, whereas the SiC seed crystal 40 is disposed on an upper wall 51 of the growing chamber 50.

The mean grain diameter of the Si powder 10 is 200 $\mu$m, and the mean grain diameter of the C powder 20 is 50 $\mu$m. This on the one hand prevents the C powder 20, on account of an insufficient mass, during the reaction for the production of SiC source material being fluidized into the clear space 55 and in particular also as far as the SiC seed crystal 40. On the other hand, however, the selected mean grain diameter also ensures that sufficiently homogeneous intimate mixing takes place, leading to a good yield during the production of the SiC source material. For this purpose, the SiC powder 10 and the C powder 20 have been intensively mixed with one another before being introduced into the growing chamber 50.

The synthesis of the SiC source material from the Si powder 10 and the C powder 20, as well as the actual growing of an SiC single crystal, in the present method are integrated into a process which can be carried out continuously. The synthesis of the SiC source material takes place in a heating phase that is in any case required for the growth. This phase is extended only slightly as a result. On the other hand, a separate process for the production of the SiC source material is eliminated altogether. The process step for the production of the SiC source material that precedes the actual growing process step proceeds as now described.

The growing chamber 50 is initially heated to a temperature of approximately 1200° C. and is evacuated for several hours at this temperature. As soon as the pressure has been reduced to at least $10^{-4}$ mbar, argon is introduced into the growing chamber. The argon gas pressure is set at a level of 500 mbar. Then, the growing chamber 50 is heated to a synthesis temperature of 1500° C. Above a temperature of approximately 1400° C., the Si powder 10 melts and impregnates the C powder 20, with the result that a further improved homogeneous mixing is established. At the selected synthesis temperature, the carbon and the silicon react with one another and form the SiC source material. After a residence time of approximately one hour at the synthesis temperature of 1500° C., during which the reaction for the formation of the SiC source material takes place, the growing chamber 50 is brought to growing conditions. This results in that the temperature of the SiC source material produced is raised to 2400° C., and at the same time the overall pressure in the growing chamber 50 is lowered to 3 mbar. At the same time, the temperature at the SiC seed crystal 40 is set at a level which is up to about 500° C. below the temperature of the SiC source material. On account of the temperature gradient that is then established, the sublimed SiC in the gas phase is transported to the SiC single crystal 40. The SiC single crystal grows as a result of the SiC in the gas phase being deposited on the SiC seed crystal 40.

Figure 2:
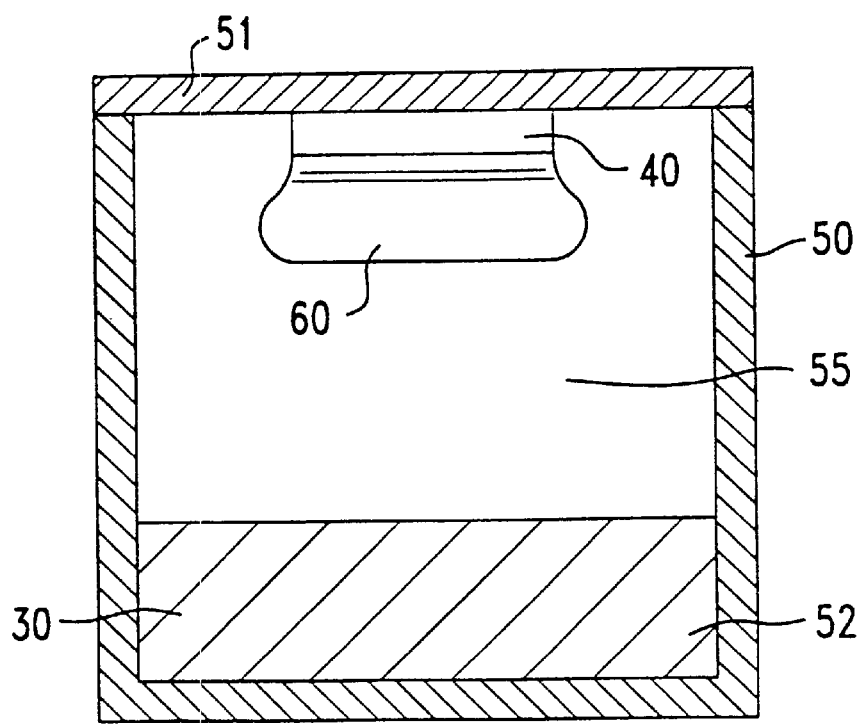
FIG. 2 is a sectional view of the growing chamber after the process step for production of the SiC source material and during the process step for growing of the SiC single crystal.

FIG. 2 shows the growing chamber 50 at a time at which the formation of a SiC single crystal 60 has already commenced. The SiC material which is deposited on the SiC seed crystal 40 or on the SiC single crystal 60 in the process is in this case formed by sublimation of the SiC source material 30. The SiC source material 30 has been produced from the Si powder 10 and the C powder 20 in accordance with the preceding first process step described with reference to FIG. 1.

Compared to two processes that proceed separately, the growing method described with the integrated process step for the production of the SiC source material 30 leads to a considerable time saving, which is up to 12 hours. It results in particular from the omission of an additional cooling and heating phase and from the elimination of changeover measures or transferring the SiC source material 30 produced.

It will be understood that the growing chamber 50 shown in FIGS. 1 and 2 is only diagrammatically illustrated. In embodiments that are not shown, the growing chamber 50 may therefore also be of more complex structure. By way of example, the free space 55 may, by configurations measures, be formed in such a way that SiC which sublimes out of the SiC source material 30 is passed directly to the SiC seed crystal 40. The configuration measure may in this case adopt the form of a gas duct.

Moreover, the growing method was described above, without restricting its general applicability, on the basis of an example relating to the growing of one SiC single crystal. However, it is also readily possible for a plurality of SiC single crystals 60 to be produced in the growing chamber 50. For this purpose, by way of example a plurality of SiC seed crystals 40 are disposed in the growing chamber 50, and an SiC single crystal 60 is then grown onto each of these seed crystals.

We claim:

1. A method for growing at least one silicon carbide (SiC) single crystal by sublimation of an SiC source material, which comprises the steps of:

introducing silicon (Si), carbon (C) and an SiC seed crystal into a growing chamber, the carbon being a C powder with a mean diameter of powder grains of greater than 10 $\mu$m;

producing the SiC source material from the silicon and the carbon in a synthesis step carried out before a growing step; and carrying out the growing step by growing the SiC single crystal immediately after the synthesis step.

2. The method according to claim 1, which comprises selecting the mean grain diameter of powder grains of the C powder to be greater than 20 $\mu$m.

3. The method according to claim 1, which comprises selecting the mean grain diameter of the powder grains of the C powder to be less than 200 $\mu$m.

4. The method according to claim 1, which comprises selecting the carbon to be a type of carbon which reacts with the silicon to form the SiC source material substantially without energy being released.

5. The method according to claim 4, which comprises providing the C powder with grains composed of at least ten individual crystallites.

6. The method according to claim 1, which comprises providing the silicon as a silicon powder with a mean grain diameter of at most 1 mm.

7. The method according to claim 6, which comprises mixing the silicon powder and the C powder to form a homogeneous mixture before being introduced into the growing chamber.

8. The method according to claim 1, which comprises heating the growing chamber to 1200° C. and then evacuating the growing chamber at 1200° C. to a pressure of less than or equal to $10^{-4}$ mbar.

9. The method according to claim 8, which comprises filling the growing chamber with an inert gas selected from the group consisting of argon (Ar), helium (He) and hydrogen ($H_2$), and setting an inert gas pressure of between 100 and 1000 mbar.

10. The method according to claim 9, which comprises heating the silicon and the carbon to a synthesis temperature of between 1200° C. and 1900° C., and holding at the synthesis temperature for a period of at most three hours, during which a reaction between the silicon and the carbon to form the SiC source material takes place.

11. The method according to claim 10, wherein the growing chamber, starting from the synthesis temperature and the inert gas pressure, is brought to growing conditions, in which the SiC source material is heated to a temperature of between 2100° C. and 2500° C., and an overall pressure of at most 30 mbar is set.

12. The method according to claim 1, which comprises introducing the silicon and the carbon into a lower storage region in the growing chamber, and the SiC seed crystal is attached to an upper wall, so that there is a clear space between the SiC seed crystal and the silicon and the carbon.

13. The method according to claim 1, which comprises growing a 4H-SiC single crystal, the SiC seed crystal being disposed such that it has a growth surface corresponding to a carbon-side of a direction of a polar axis.

14. The method according to claim 1, which comprises growing a 6H-SiC single crystal, the SiC seed crystal being disposed such that it has a growth surface corresponding to an silicon-side of a direction of a polar axis.

15. The method according to claim 1, which comprises selecting the mean grain diameter of the C powder to be greater than 30 $\mu$m.

16. The method according to claim 1, which comprises selecting the mean grain diameter of the C powder to be less than 80 $\mu$m.

17. The method according to claim 1, which comprises providing the silicon as a silicon powder with a mean grain diameter of between 100 $\mu$m and 400 $\mu$m.

18. The method according to claim 9, which comprises heating the silicon and the carbon to a synthesis temperature of between 1400° C. and 1600° C., and holding at the synthesis temperature for a period of at most one hour, during which a reaction between the silicon and the carbon to form the SiC source material takes place.

* * * * *